Figure 1:
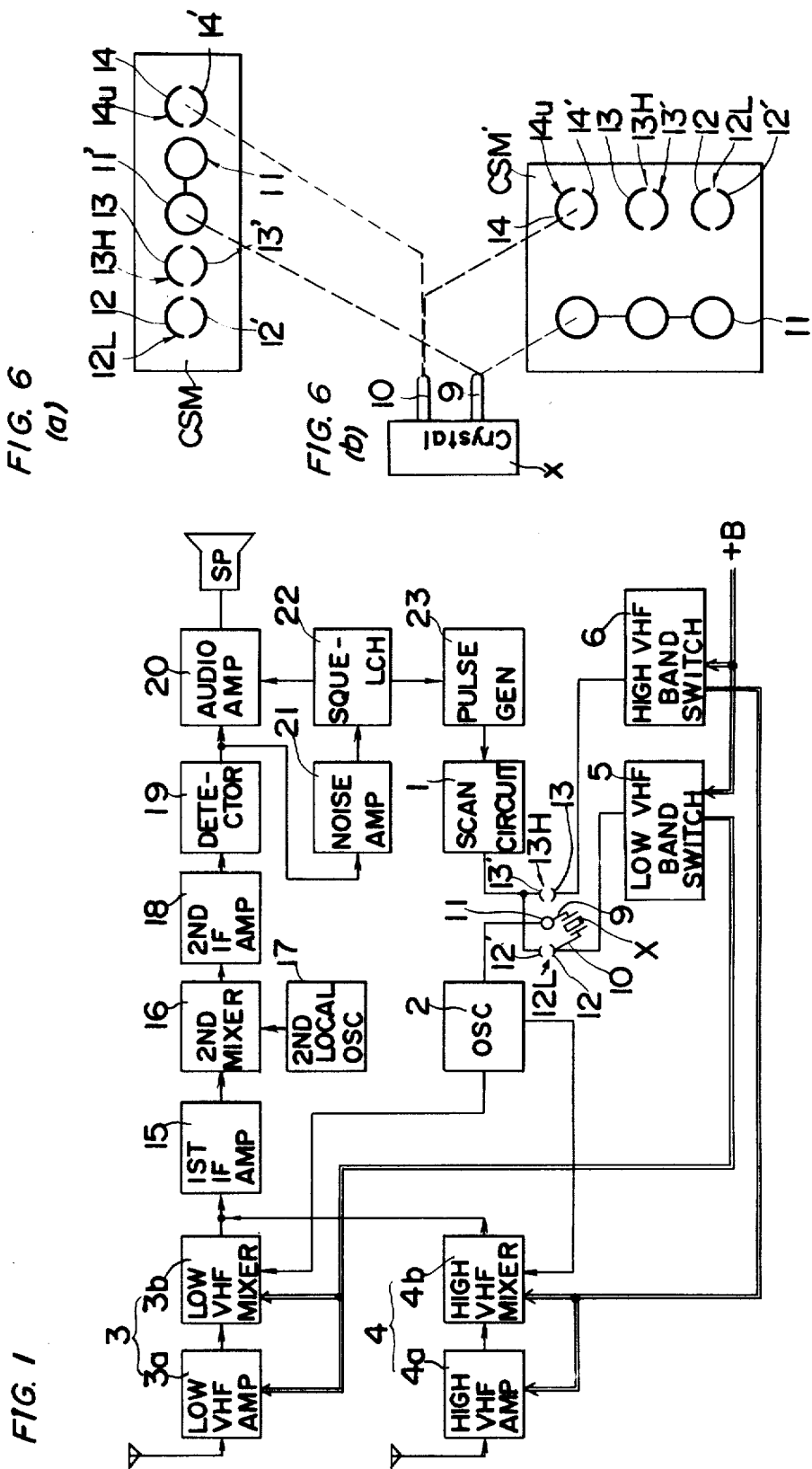

United States Patent [19]

Okada

[11] 4,000,470
[45] Dec. 28, 1976

[54] RADIO RECEIVER

[75] Inventor: Hisao Okada, Neyagawa, Japan

[73] Assignee: Sanyo Electric Co., Ltd., Moriguchi, Japan

[22] Filed: Apr. 10, 1975

[21] Appl. No.: 566,831

[30] Foreign Application Priority Data

Apr. 18, 1974 Japan .............................. 49-44115
Mar. 6, 1975 Japan .............................. 50-27675

[52] U.S. Cl. .............................. 325/470; 325/459; 325/460
[51] Int. Cl.² .......................................... H04B 1/32
[58] Field of Search .......................... 325/458–461, 325/464, 465, 468–470

[56] References Cited
UNITED STATES PATENTS

| | | | |
|---|---|---|---|
| 3,821,651 | 6/1974 | Fathauer | 325/470 |
| 3,824,475 | 7/1974 | Pflasterer | 325/470 |
| 3,873,924 | 3/1975 | Fathauer | 325/470 |
| 3,895,303 | 7/1975 | Imazeki et al. | 325/470 |

*Primary Examiner*—Robert L. Griffin
*Assistant Examiner*—Marc E. Bookbinder
*Attorney, Agent, or Firm*—Darby & Darby

[57] ABSTRACT

A radio receiver for use in monitoring a plurality of channels of predetermined frequencies in a plurality of predetermined frequency bands, in which radio receiver, specially arranged receptacles for crystal insertion comprising common receptacles and corresponding receptacles each composed of a pair of conductive means are incorporated for efficient band selection and frequency setting by merely inserting crystals in the receptacles. The radio receiver further includes an auxiliary tripler for ensuring optimum performance even when the triple frequency relation in the frequency multiplication is deviated from in the plurality of frequency bands.

21 Claims, 7 Drawing Figures

RADIO RECEIVER

This invention relates to a radio receiver, and more particularly, to a radio receiver for use in monitoring a plurality of selected transmission channels in a plurality of frequency bands.

Commonly, such radio receivers mostly utilizing FM signals are widely used in the United States for various activities, for example, for fire brigade, public security, highway patrol and weather forecasting or the like. In the United States, various sorts of information or news are transmitted, whenever need arises, through particular frequency bands outside the ordinary broadcasting bands for the general public. Such particular transmissions are wellknown as PSB (Public Service Broadcasting), to which three major frequency bands are allocated, i.e., a low VHF band in the range of 30 to 50 MHz, a high VHF band of 150 to 170 MHz and a UHF band of 450 to 470 MHz.

Since such particular information and news are transmitted intermittently only when necessary, radio receivers for use in monitoring the same are mainly of automatic scanning channel selection type, in which radio receivers a predetermined plurality of frequencies are automatically scanned sequentially with the receivers adapted to be locked on a frequency only if there is a transmission being received on that frequency.

In the above described particular broadcasting or transmission, since the frequency bands are allocated thereto normally at an interval of 30 KHz, the radio receiver for receiving such transmission is so arranged that a listener thereto selects proper crystals suitable for the desired frequencies for inserting the same into the recieving circuit of the receiver, or for exchanging such crystals depending on the situation. In practice, radio receivers ranging from those of four channel type capable of receiving four stations to those of eight to 16 channel type are widely employed.

As one of such radio receivers of the above described type, there has conventionally been proposed, for example, in U.S. Pat. No. 3,531,724, a signal-seeking receiver operable on several discrete preselected frequencies in one band, employing electronic circuitry for automatically switching the receiver from one of the frequencies to another in sequence until a signal is received on one of the frequencies in the particular band, with the receiver, upon reception of a signal, "locking in" on that frequency for receiving said signal, and with the receiver, upon termination of said signal, continuing sequential switching operation thereof until another signal or carrier appears on one of the frequencies in said one band.

The above described prior art signal-seeking radio receiver of superheterodyne type for receiving and reproducing frequency modulated signals includes a radio frequency amplifier coupled to an antenna, a first mixer coupled to said radio frequency amplifier, a second mixer coupled to said first mixer with a local oscillator coupled to said second mixer, an intermediate frequency amplifier coupled to said second mixer, and a limiter detector coupled to an audio amplifier, each being of known construction, which signal-seeking radio is characterized by the further incorporation therein a scanning control coupled to said limiter detector and audio amplifier, a scanning signal generator of conventional multivibrator type coupled to said scanning control, a frequency divider coupled to said scanning signal generator, and a multiple channel oscillator coupled to said frequency divider and also to said first mixer for correspondingly switching the receiver to receive radio frequency signals on different frequencies in the one predetermined frequency band.

In order to cover a plurality of frequency bands, there has also conventionally been proposed a radio receiver for two band coverage, for example, by the U.S. Pat. No. 3,665,318, which prior art radio receiver comprises a pair or radio frequency amplifiers coupled to an antenna with said radio frequency amplifiers adapted to receive separate frequency bands, a pair of mixers each coupled to respective one of said radio frequency amplifiers, an oscillator coupled to said mixers, an intermediate frequency amplifier and audio secton coupled to said mixers, tuning apparatus tunable to a given plurality of channels, means for stepping said tuning apparatus through said given plurality of channels in a regular order, means for locking said tuning apparatus on a given channel as long as a signal is received on that channel, and means for presetting said channels of said tuning apparatus to couple either one or the other of said radio frequency amplifiers and respective mixer to said intermediate frequency amplifier and audio section for pre-selecting the frequency received by each channel from one or the other of said bands.

The radio receiver disclosed in said U.S. Pat. No. 3,665,318, however, has such disadvantages that proper crystals for desired frequencies must be selected and inserted in positions between the diode switching circuit and the oscillator, with said crystals required to be exchanged for those of desired frequencies, depending on channels to be monitored, and that the jack for the band selector matrix must be inserted in an appropriate receptacle of either of the two terminal receptacle groups in order to select desired one of the high and low bands, requiring two step procedures of inserting or exchanging the crystals, and also inserting the jacks for band selection in actual use. This arrangement is particularly inconvenient for the listeners of such radio receivers to select desired frequency and band efficiently.

Another radio receiver for three band reception has conventionally been proposed, for example, by the U.S. Pat. No. 3,824,475, which automatically scans a plurality of channels of respective predetermined radio frequencies lying in a multiplicity of frequency bands with the channels thereof being turned in successively by successively coupling respective tuning crystals into the tuning circuit of a signal generator which produces the beating signals for heterodyning, and which covers three bands, i.e., the low VHF band in the range of 30 to 50 MHz, the high VHF band in the range of 150 to 170 MHz and the UHF band in the range of 450 to 470 MHz.

In the above described prior art radio receiver disclosed in said U.S. Pat. No. 3,824,475, a low VHF band switch applies an operating voltage to a low VHF band mixer, producing a beat frequency subsequently processed to produce an audio signal, and in the high VHF band, a crystal oscillating at a relatively low frequency is utilized, so that upon actuation of high VHF band switch, a harmonic of that frequency is produced to be introduced into the high VHF band mixer for heterodyning, with a still higher harmonic utilized in the UHF band, and with the band switches adapted to turn on respective frequency-multiplying circuits which produce third and ninth harmonic beating signals for heterodyning. In other words, the signal from the crystal oscillator is applied to a frequency multiplying circuit or a first tripler operating to produce a frequency-multiplied signal at a multiple of the frequency of the oscillator with another frequency-multiplying circuit or a second tripler producing a second frequency-multiplied signal at a multiple of the frequency of the first frequency-multiplied signal, in which arrangement, when the fundamental frequency of the crystal oscillator for the low VHF band is 50 MHz, the harmonics of that frequency produced to be introduced into the high VHF and UHF bands are to be 150 MHz and 450 MHz respectively. However, when recent trend to widen the band range, such as widening the UHF band range from the present 450-470 MHz to 450-512 MHz is taken into account, the above described prior art radio receiver also has inherent disadvantages from the viewpoint of frequency multiplication.

Commonly, in the conventional radio receivers of the above described type, frequencies in the low VHF band are approximately tripled successively in the high VHF and the UHF bands in such a manner that the output of the fundamental oscillator is directly supplied to the mixer for the low VHF band, while the output of the fundamental oscillator is tripled through the first tripler so as to be supplied to the mixer for the high VHF band with the output from the first tripler being further tripled through the second tripler (nine times the fundamental oscillation frequency) so as to be applied to the mixer for the UHF band, in which arrangement, although there is no problem so long as the frequency in the UHF band is exactly three times that of the high VHF band, following disadvantages arise when the triple relation of the frequencies between the above two bands is deviated. Namely, when the frequency at the second tripler is desired to be $(9fo + \Delta f)$, optimum voltage is applied to the mixer of the UHF band if the frequency at the first tripler is adjusted to be $(3fo + \frac{1}{3}\Delta f)$, but the applied voltage is inevitably decreased since a deviation by $\frac{1}{3}\Delta f$ is caused relative to the frequency $3fo$ of the first tripler for applying optimum voltage to the mixer for the high VHF band. On the contrary, if the first tripler is adjusted to be $3fo$ mainly based on the high VHF band, the frequency at the second tripler is to be $9fo$ with deviation of $\Delta f$. As described above, in the conventional radio receivers of known frequency multiplication type, if the triple frequency relation between the high VHF band and the UHF band is deviated from, performance of such receivers is heavily degraded since optimum adjustments in one of the bands result in deviation in the other band.

Accordingly, an object of the present invention is to provide a radio receiver of multi-band type which can be set to desired frequencies in desired bands simply by a single operation with substantial elimination of the disadvantages inherent in the conventional radio receivers.

Another object of the present invention is to provide a radio receiver of the above described type which is equipped with an independent tripler for each band so as to offer accurate performance without deviation in frequency multiplication.

A further object of the present invention is to provide a radio receivers of the above described type which is simple in construction and can be manufactured at relatively low cost.

A still further object of the present invention is to provide a radio receivers of the above described type which is simple in operation and compact in size, and which can be advantageously operated by the user.

According to a preferred embodiment of a radio receiver of the present invention, special arrangements and constructions are employed in receptacles for accepting terminals of a crystal to achieve insertion of the crystal and band selection simply by one operation. More specifically, in the radio receiver of the present invention, the receptacles for the terminals of crystal comprise first common receptacles each coupled to an oscillator in an electrical circuit of the radio receiver and each adapted to accept or receive one of the terminals of a crystal, and second receptacles for accepting the other of the terminals of the crystal, each of which second receptacles composed of a pair of conductive members, such as opposed plates of semi-circular cross section, with a space kept between the opposed plates to be short-circuited when the other terminal of the crystal inserted therein and to resiliently hold said other terminal of said crystal therebetween. One of said pair of said opposed plates is connected to a predetermined point in the circuit, which predetermined point is either the receiver electrical common point or the scanning means or the like, for inserting the crystal means into an oscillating circuit of said radio receiver. In other words, the one of said pair of said opposed plates is connected either to the common or to a collector of a transistor in a channel automatic scanning circuit, while the other of said pair of said opposed plates is connected to a base of a transistor of a band switching circuit of said radio receiver, so that upon insertion of the crystal, said pair of said opposed plates for the second receptacle which is short-circuited by said other terminal of the crystal connects the band switching circuit to the common through the resistor or connects the channel automatic scanning circuit to the band switching circuit through the resistor, while said other terminal of the crystal inserted in said second receptacle is connected to the common point through a diode and/or a transistor connected to the channel automatic scanning circuit of the radio receiver. By arranging a plurality of such receptacles comprising a pair of opposed plates and suitably connected to different band sources, relative to corresponding common receptacles, efficient band selection and frequency setting can advantageously be achieved through a single operation by a mere insertion of a crystal of desired frequency into such receptacles.

Figure 2:
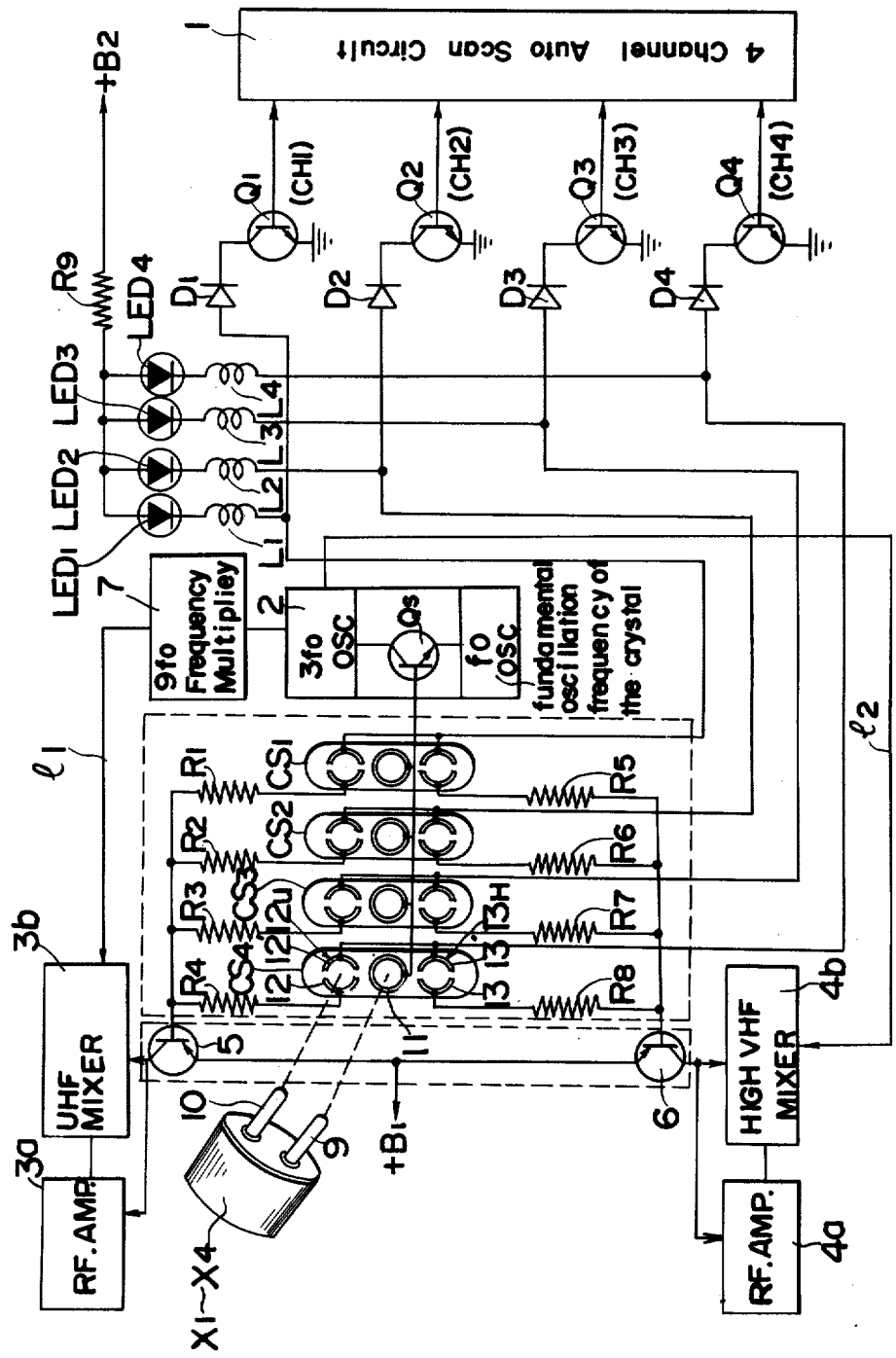
Figure 3:
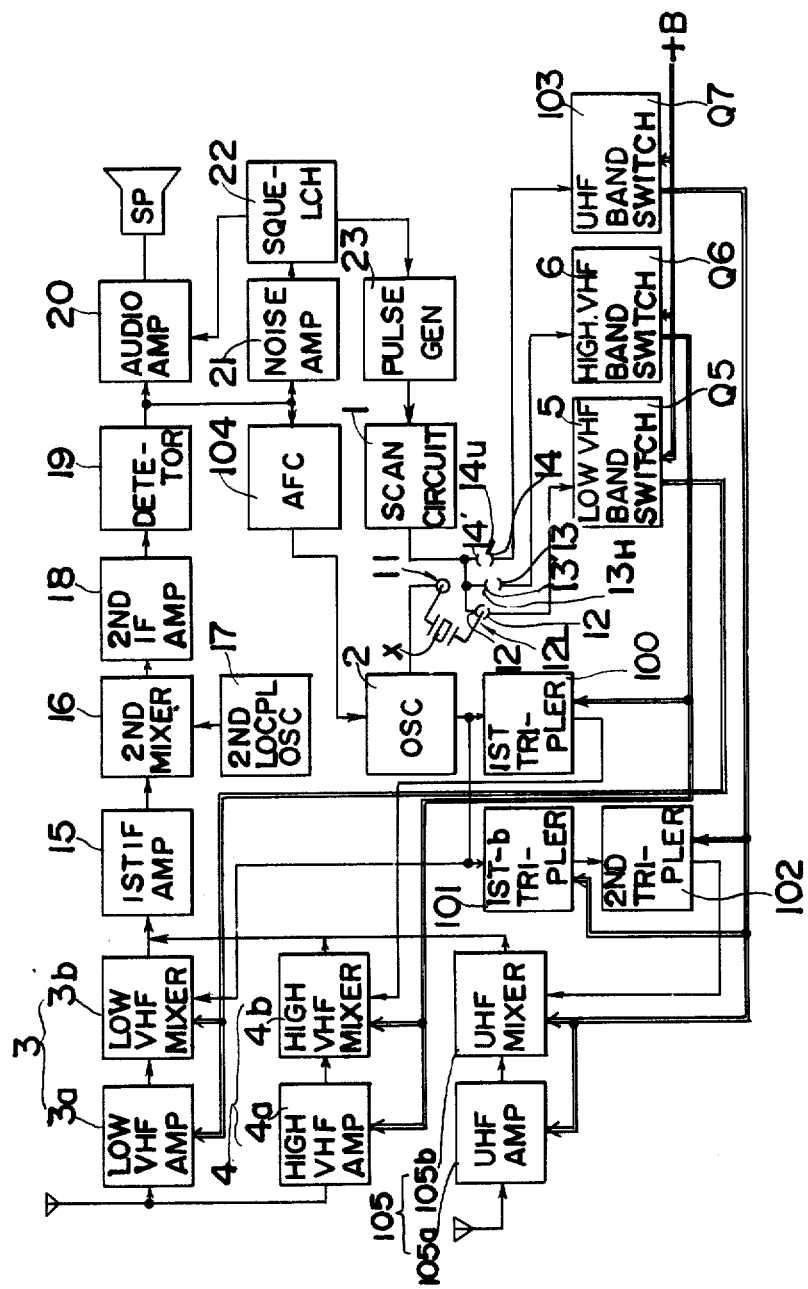
Figure 4:
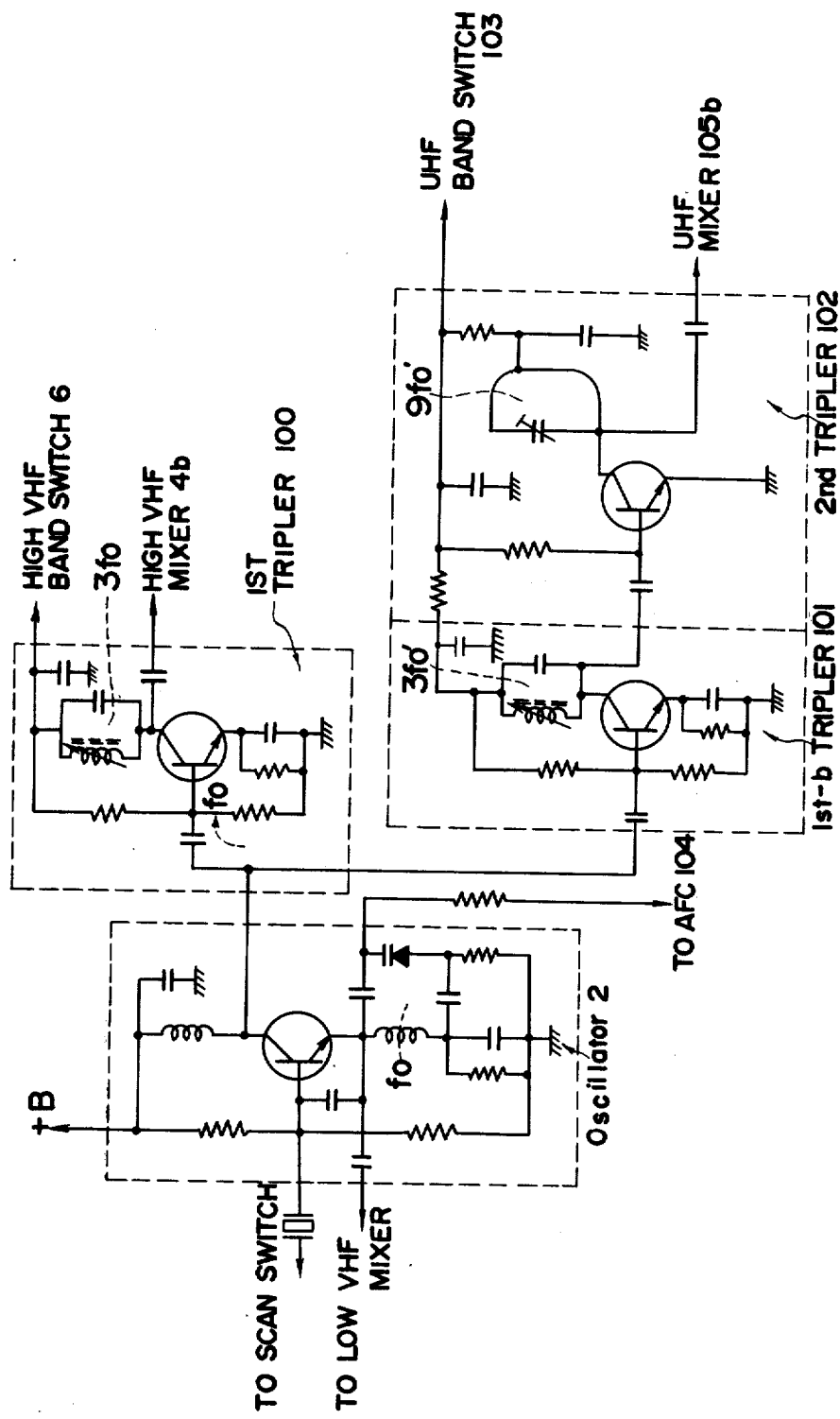
Figure 5:
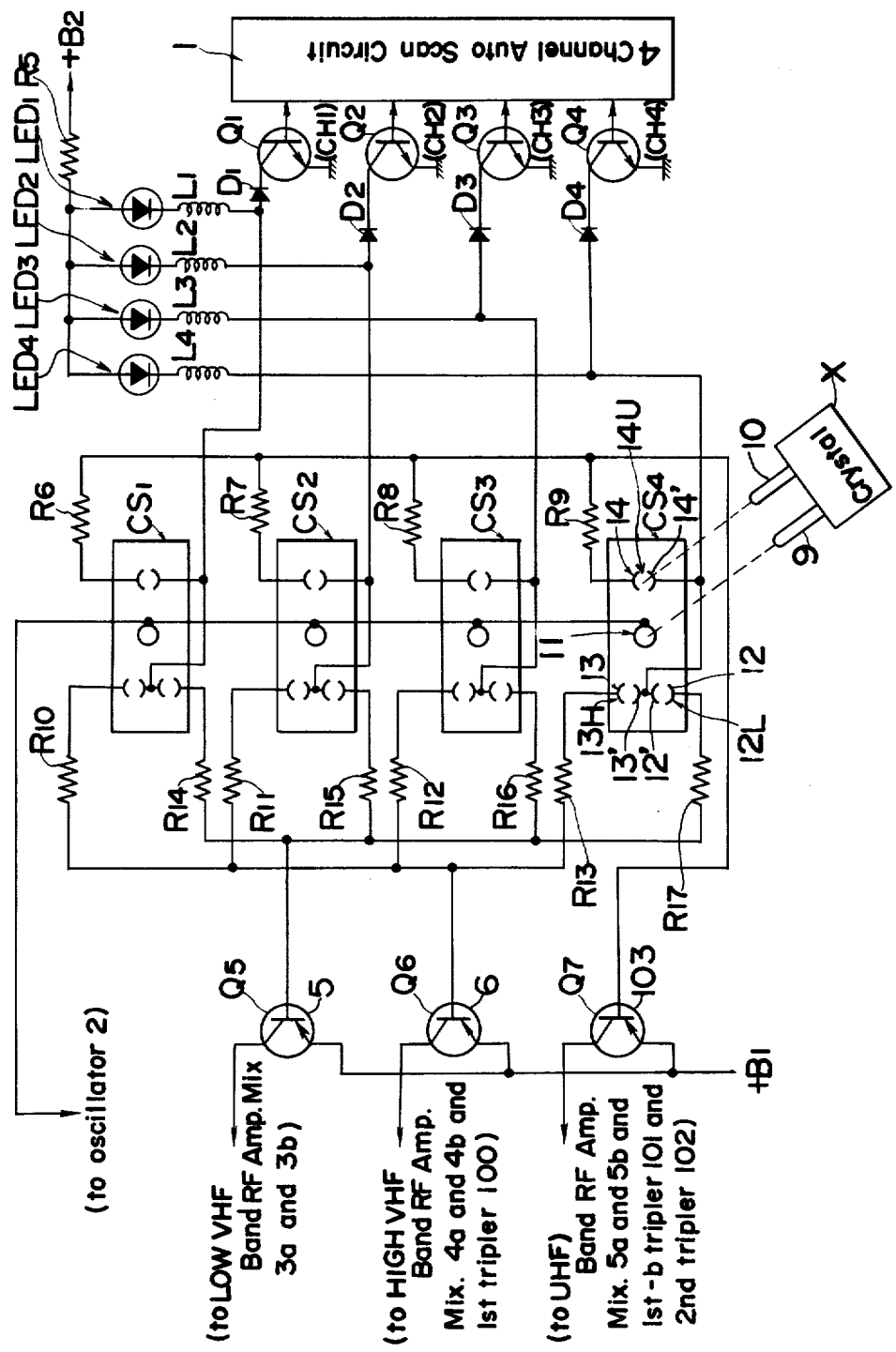

These and other objects and features of the present invention will become apparent from the following description taken in conjunction with a preferred embodiment thereof with reference to the accompanying drawings in which;

FIG. 1 is an electrical block diagram of a radio receiver of automatic scanning channel selection type according to one embodiment of the present invention, FIG. 2 is a schematic electrical block diagram, particularly showing a modification of crystal receptacles of the radio receiver of FIG. 1, FIG. 3 is an electrical block diagram showing a modification of the radio receiver of automatic scanning channel selection type of FIG. 1, FIG. 4 is an electrical circuit diagram showing an important portion of the radio receiver of FIG. 3, FIG. 5 is a schematic electrical block diagram, particularly showing another modification of crystal receptacles of the radio receiver of FIG. 3, and FIG. 6a and 6b are schematic top plan views showing further modifications of crystal receptacles of the radio receiver of FIG. 3.

Referring now to FIG. 1, there is shown an electrical block diagram of a radio receiver of automatic scanning channel selection type for two band reception of the invention. Although radio receivers capable of receiving four channels, eight channels or 16 channels are commonly used in practice, the radio receiver shown in the embodiment of FIG. 1 employs one crystal for better understanding of the function thereof, and includes a pair of radio frequency amplifiers 3a and 4a coupled to an antenna for receiving separate frequency bands, i.e., a low VHF band and a high VHF band, which radio frequency amplifiers 3a and 4a are each coupled to corresponding mixers 3b and 4b, an oscillator 2 coupled to the mixers 3b and 4b which are subsequently coupled to a first intermediate amplifier 15, a second mixer 16 coupled to the first intermediate amplifier 15, a second intermediate frequency amplifier 18 coupled to the second mixer 16 with a second local oscillator 17 connected to the second mixer 16, a detector 19 coupled to the second intermediate frequency amplifier 18, and an audio amplifier 20 coupled to the detector 19 with the audio amplifier 20 connected to a speaker in a known manner. A noise amplifier 21 is connected to a common junction of the detector 19 and the audio amplifier 20 with the noise amplifier 21 subsequently coupled to a squelch switch 22 which is in turn coupled to the audio amplifier 20 and a pulse generator 23, the pulse generator 23 being further coupled to an automatic scanning circuit 1 which is connected to receptacles 12L and 13H for accepting the other terminal 10 of a crystal X. Each of the receptacles 12L and 13H further comprises a pair of opposed plates 12 and 12' or 13 and 13' of semi-circular cross section with the opposed plates 12 and 12' or 13 and 13' spaced away to a certain extent from each other. The automatic scanning circuit 1 is connected to first plates 12' and 13' of the receptacles 12L and 13H, while second plates 12 and 13 of the receptacles 12L and 13H are each connected to a corresponding low VHF band switch 5 and high VHF band switch 6. The band switches 5 and 6 are each coupled to the low VHF amplifier 3a and mixer 3b, and to the high VHF amplifier 4a and mixer 4b with the band switches 5 and 6 further connected to +B power source. A common receptacle 11 for accepting the one terminal 9 of the crystal X disposed in a position between the receptacles 12L and 13H and further connected to the oscillator 2. By this arrangement, when the terminals 9 and 10 of a crystal X is inserted, for example, in the receptacles 11 and 12L, the one terminal 9 of the crystal X accepted in the common receptacle 11 is connected to the oscillator 2, while the other terminal 10 of the crystal X accepted in the receptacle 12L short-circuits the plates 12 and 12', thus the scanning switch 1 being connected to the low VHF band switch 5, with the desired band and frequency thus set in one operation. When the terminals 9 and 10 of the crystal X are inserted into the receptacles 11 and 13H with the one terminal 9 thereof accepted in the common receptacle 11, the high VHF band is automatically selected and desired frequency is simultaneously set in the similar manner as described above.

It should be noted here that the circuit and function of the radio receiver described above are conventional, except for the arrangement of the crystal receptacles which are incorporated in said circuit and composed of the common receptacle 11 and the receptacles 12L and 13H, which arrangement is directly relevant to the present invention.

Referring now to FIG. 2, there is shown a modification of the crystal receptacles of the radio receiver of FIG. 1. In this modification, four sets of receptacles CS1 to CS4 are provided for accepting a plurality of crystals, for example, $X_1$ to $X_4$, simultaneously. The common receptacle 11 of each of the receptacles CS1 to CS4 is connected to the base of a transistor Qs in the oscillation circuit 2, and a tuning circuit tunable to the fundamental oscillation frequency $fo$ is provided at the emitter side of the oscillator transistor Qs, while another tuning circuit tunable to the frequency $3fo$ is provided at the collector side of the transistor Qs, which collector is further connected to the high VHF band mixer 4b through a line $l_2$ and simultaneously connected to the frequency multiplier 7 which generates output of frequency $9fo$, with said frequency multiplier circuit 7 being in turn connected to the UHF band mixer 3b through a line $l_1$.

The first plates 12' and 13' of the receptacles 12U and 13H are each connected to the channel automatic scanning circuit 1 through corresponding diodes $D_1$ to $D_4$ and transistors $Q_1$ to $Q_4$, with the second plates 12 of the receptacles 12U being each connected to the base of the switching transistor 5 through corresponding one of resistors $R_1$ to $R_4$, the collector of said switching transistor 5 being connected to the UHF band radio frequency amplifier 3a and mixer 3b, and with the second plates 13 of the receptacles 13H being each connected to the base of the switching transistor 6 through corresponding one of resistors $R_5$ to $R_8$, the collector of said switching transistor 6 being connected to the high VHF band radio frequency amplifier 4a and mixer 4b. The emitters of the switching transistors 5 and 6 are connected by a line which is further connected to a $+B_1$ voltage source. Indication means, for example, light emitting diodes $LED_1$ to $LED_4$ are connected in parallel to each other through reactances $L_1$ to $L_4$, to lines leading from the plates 12' and 13' to the diodes $D_1$ to $D_4$ respectively for showing which of the channels $Ch_1$ to $Ch_4$ is being received, with the diodes $LED_1$ to $LED_4$ further connected to a line leading to $+B_2$ voltage source through a resistor $R_9$.

By this arrangement, the automatic scanning circuit 1 to be switched sequentially by the pulse generator 23 shown in FIG. 1, such as an astable multivibrator selectively connects, to the earth, the other terminal 10 of a plurality of crystals $X_1$ to $X_4$ which are commonly connected, each at the one terminal 9 thereof, to the oscillator 2 for exciting said oscillator 2 at a particular frequency. Output from the oscillator 2 is supplied to the mixer 3b for the UHF band through the frequency multiplier 7 and the line $l_1$ when the crystals $X_1$ to $X_4$ are inserted into the receptacles 11 and 12U, and the same is supplied to the mixer 4b for the high VHF band through the line $l_2$ when the crystals $X_1$ to $X_4$ are inserted into the receptacles 11 and 13H, while either of the radio frequency amplifiers and mixers 3a and 3b or 4a and 4b is supplied with power through conduction or non-conduction of the switching transistors 5 or 6, depending upon the insertion of the crystals $X_1$ to $X_4$ either to the receptacles 11 and 12U or 11 and 13H. On the assumption that the crystals $X_4$ is inserted in the receptacles 11 and 12U with the terminal 9 of the crystal $X_4$ accepted in the common receptacle 11, and when the automatic scanning circuit 1 sequentially scanning channels detects a signal on the channel $Ch_4$, the transistor $Q_4$ is rendered conductive and the crystal $X_4$ is connected to the electrical common point through the transistor $Q_4$ and diode $D_4$, while the switching transistor 5 is also rendered conductive for supplying power to the UHF band radio frequency amplifier $3a$ and mixer $3b$ so as to enable the radio receiver to receive broadcasting on that UHF band, and thereafter the radio receiver function in a known manner to drive the speaker through intermediate frequency amplification, detection and audio frequency amplification circuits as described in the circuit of FIG. 1. Although not shown for brevity in FIG. 2, the radio receiver is adapted to control the automatic scanning circuit 1 through a control circuit, such as the squelch switch 22 shown in FIG. 1, and the astable multivibrator for detecting transmission on another channel, as soon as the transmission being received disappears on that particular channel.

It is needless to say that in actual use of the radio receiver of FIG. 2, four crystals $X_1$ to $X_4$ of desired frequencies suitable for corresponding bands can be inserted simultaneously in the receptacles $CS_1$ to $CS_4$ in any order, and that the number of the receptacles is not limited to four, but may be increased or decreased, depending on the monitoring requirements.

It should also be noted that the arrangement of the receptacles 12U or 13H relative to the common receptacles 11 may be altered in various ways within the scope of the invention.

Referring now to FIGS. 3 and 4, there is shown a modification of the radio receiver of automatic scanning channel selection type of FIG. 1. In this modification, the radio receiver is adapted to cover three frequency bands, i.e., the low VHF band, the high VHF band and the UHF band, and in comparison with the circuit of the radio receiver of FIG. 1, further includes UHF radio frequency amplifier and mixer $105a$ and $105b$, a first tripler 100, a first-b tripler or an auxiliary tripler 101, a second tripler 102, a UHF band switch 103, an automatic frequency control 104, and modified receptacles for one crystal X. The oscillator 2 is coupled to the automatic frequency control 104. The detector 19 is connected to the automatic frequency control 104 and the noise amplifier 21. The oscillator 2 is also coupled to the low VHF mixer $3b$, the first tripler 100 which is in turn coupled to the high VHF mixer $4b$, and to the first-b tripler 101. The first-b tripler 101 is in turn coupled to the second tripler 102 which is further coupled to the UHF mixer $105b$. The oscillator 2 is further connected to a common receptacle 11 for the crystal X, while first pltes 14', 13' and 12' of three pairs of opposed plates 14, 14', 13, 13' and 12, 12' having semi-circular cross section and forming receptacles 14U, 13H and 12L are connected to the automatic scanning circuit 1. Second plates 12, 13 and 14 of the receptacles 12L, 13H and 14U are respectively connected to the low VHF radio frequency amplifier and mixer $3a$ and $3b$, the high VHF radio frequency amplifier and mixer $4a$ and $4b$ and to the UHF radio frequency amplifier and mixer $105a$ and $105b$ through band-switching means, i.e., the low VHF band switch 5 (transistor Q5), the high VHF band switch 6 (transistor $Q_6$) and the UHF band switch 103 (transistor $Q_7$) respectively. The high VHF band switch 6 is also connected to the first tripler 100, while the UHF band switch 103 is also connected to the first-b tripler 101 and the second tripler 102. It is to be noted that the band-switching means is provided for actuating each of said radio frequency sections for each of the first, second and third bands and also for actuating the first tripler 100, the first-b tipler 101 and the second tripler 102. By this arrangement, the frequency output $fo$, for example, of 50 MHz from the oscillator 2 is tripled by the first tripler 100 to $3 fo$, for example, to 150 MHz which is adjusted to $3fo'$, for example, to 156 MHz at the first-b tripler 101, and further tripled to obtain the output $9fo'$, for example, of 470 MHz at the second tripler 102, by which arrangement, for example, even when the frequency at the UHF band is not exactly three times that of the high VHF band, deviation arising therefrom is advantageously cancelled, thus ensuring optimum performance of the radio receiver.

It should be noted here that the function of the first-b tripler 101 is to produce an oscillation frequency which is deviated from that of said first tripler 100 by to a predetermined extent.

It should also be noted that the functioning of the radio receiver described above are conventional, except for the arrangements of the crystal receptacles composed of the common receptacle 11 and the receptacles 14U, 13H and 12L, and the first-b tripler 101 incorporated in the circuit, which arrangements are directly relevant to the present invention.

Referring now to FIG. 5, there is shown a modification of the crystal receptacles of the circuit of FIG. 3. In this modification, each of the four sets of the receptacles $CS_1$ to $CS_4$ comprises a common receptacle 11 for accepting the one terminal 9 of the crystal X which is connected to the oscillator 2 and three pairs of opposed plates 14, 14', 13, 13' and 12, 12', each having semi-circular cross section and forming receptacles 14U, 13H and 12L for accepting the other terminal 10 of the crystal X so as to be short-circuited upon insertion of said terminal 10 therein. The first plates 14, 13 and 12 of the receptacles 14U, 13H and 12L are connected respectively to the bases of the transistors $Q_7$, $Q_6$ and $Q_5$ through either one of the corresponding resistors $R_6$ to $R_9$, $R_{10}$ to $R_{13}$, and $R_{14}$ to $R_{17}$, while second plates 14', 13' and 12' of the receptacles 14U, 13H and 12L are connected to the collectors of the transistors $Q_4$, $Q_3$, $Q_2$, and $Q_1$ of the automatic scanning circuit 1 through corresponding diodes $D_4$, $D_3$, $D_2$ and $D_1$. If a crystal X is inserted, for example, in the receptacle 14U with the one terminal 9 of the crystal X accepted in the common receptacle 11, the pair of opposed plates 14 and 14' of the receptacle 14U is short-circuited by the other terminal 10 of the crystal X, thus connecting the automatic scanning circuit 1 with the switching transistor Q7 of the UHF band switching circuit 103 and with the other terminal 10 of the crystal X simultaneously connected to common through the transistor $Q_4$. For indicating the channel on which transmission is being received, four light emitting diodes $LED_1$ to $LED_4$ are connected, through reactances $L_1$ to $L_4$, to lines leading from the receptacles 14U, 13H and 12L to the transistors $Q_1$ to $Q_4$ prior to the diodes $D_1$ to $D_4$ respectively, which light emitting diodes $LED_1$ to $LED_4$ are subsequently connected to a line leading to $+B_2$ voltage source through a resistor $R_5$ in the similar manner to that in the circuit of FIG. 2.

Accordingly, if it is desired, for example, to receive the channel $Ch_1$ in the low VHF band, the one terminal 9 of the crystal X is inserted in the common receptacle 11 of the receptacle $CS_1$ with the other terminal 10 of the crystal X inserted in the receptacle 12L of the receptacle CS₁, and when the transistor Q₁ of the automatic scanning circuit 1 is rendered conductive, with th plates 12 and 12' of the receptacle 12L being connected to common through the transistor Q₁ and with the switching transistor Q₅ of the low band switching circuit 5 simultaneously rendered conductive, and the transmission on the channel Ch₁ in the low VHF band is received in the same manner as described in the circuit of FIG. 2.

It should be noted that although three receptacles 12L, 13H and 14U are shown in the modification of FIG. 5 relative to the common receptacle 11, the number of such receptacles 12L, 13H and 14U may be increased depending on the requirement.

Referring to FIGS. 6a and 6b, there are shown two modifications of the arrangement of the receptacles of FIG. 5. In the modification of FIG. 6a, the receptacle CSM offers three combinations of receptacles for the insertion of the crystal X, in which combinations the receptacles 11 and 11' serve as common receptacles, while the receptacles 14U, 13H and 12L each composed of a pair of opposed plates 14 and 14', 13 and 13' or 12 and 12' having semi-circular cross section are used for corresponding receptacles as in the circuit of FIG. 5. The three receptacle combinations are a first combination of the receptacles 11' and 14U for the UHF band, a second combination of the receptacles 11 and 13H for the high VHF band, and a third combination of the receptacles 11' and 12L for the low VHF band. It is needless to say that, in practice, a plurality of such receptacles CSM may be incorporated in the circuit for receiving transmission on a plurality of channels. Other functions of the circuit of the above described radio receiver are similar to those in the modification of FIG. 3, so that description thereof is abbreviated for brevity.

In the modification of FIG. 6b, the receptacle CSM' also offers three combination of receptacles for insertion of the crystals X, in which receptacle CSM', three common receptacles 11 are arranged in a row each of the receptacles 11 facing a corresponding receptacle 14U, 13H or 12L for accepting one of the crystls X for three bands therein. For receiving transmissions on a plurality of channels on each of the low VHF, high VHF, and UHF bands, the number of combinations of the common receptacle 11 and the corresponding receptacle 14U, 13H or 12L may be variable to meet the requirement. Construction of each of the receptacles 14U, 13H or 12L and the function of the circuit of the radio receiver are the same as in the circuit of FIG. 3, so that description thereof is abbreviated for brevity.

It should be noted here that the combinations of common receptacles and corresponding receptacles are not limited to those illustrated in the foregoing description, but may be altered in various ways within the scope of the invention.

It should also be noted that, although foregoing description on the embodiments of the radio receivers of the invention relates to those of automatic scanning channel selection type, the concept of the present invention can be readily incorporated in radio receivers of manual channel and band selection type with minor alteration of the circuit connections and employment of manual switching means in the similar manner as disclosed in the U.S. Pat. No. 2,487,857.

As is clear from the foregoing description, according to the radio receiver of the invention, since the crystal receptacles each comprising a pair of conductive members, such as opposed plates which are slightly spaced from each other are employed relative to the common receptacles for accepting terminals of the crystals with each of the pair of receptacle plates connected to the automatic scanning circuit and the band selecting switch so as to be short-circuited by the insertion of the terminals of the crystals and with the common receptacles being connected to the oscillator, band selection and frequency setting can efficiently be effected by a single operation through mere insertion of crystals into the desired receptacles, which arrangement is particularly effective in such radio receivers wherein simple operation and compact size thereof are of the first importance.

Furthermore, in the radio receiver for mutli-band reception of the invention, the incorporation of the first-b tripler in addition to the first and second triplers in the frequency multiplication circuit is advantageous for ensuring optimum and efficient reception even when the triple frequency relation in the bands is deviated, together with the employment of the above described receptacles for crystals which are directly relevant to the present invention.

Although the present invention has been fully described by way of example with reference to the attached drawings, it is to be noted that various changes and modifications are apparent to those skilled in the art. Therefore, unless otherwise such changes and modifications depart from the scope of the present invention, they should be construed as included therein.

What is claimed is:

1. A radio receiver capable of tuning to at least one predetermined frequency in each of a plurality of predetermined bands which comprises radio frequency sections for each of said bands, each of said radio frequency sections having radio frequency receiving means and mixer means coupled to said radio frequency receiving means, oscillator means for applying beating signals to each of said mixer means, at least one frequency-determining crystal means having two terminals thereon for connection to said oscillator means so that said oscillator means will oscillate at a said predetermined frequency in one of said predetermined bands, audio detection means coupled to each of said mixer means for producing an audio signal when a radio frequency signal is being received, band-switching means for selectively actuating each of said radio frequency sections of each of said plurality of said bands, and means for accepting a said frequency-determining crystal means, said accepting means including first receptacle means connected to said oscillator means and second receptacle means comprising a plurality of pairs of conductive members spaced from each other, one of said conductive members of each of said pairs connected to a predetermined point for exciting said oscillator means at a predetermined point for exciting said oscillator means at a predetermined frequency of a respective crystal means and the other of said conductive member of each of said pairs connected to said band-switching means, so that upon insertion of said two terminals of a said frequency-determining crystal means into said first and second receptacle means said crystal means is connected to said oscillator means at one terminal thereof accepted in said first receptacle means, with the other terminal of said crystal means accepted in said second receptacle means connecting the conductive members of the pair of said conductive members to connect said predetermined point with said band-switching means so as to operate said band-switching means and to actuate said radio frequency section for the band containing the predetermined frequency corresponding to said frequency-determining crystal means.

2. A radio receiver as claimed in claim 1, wherein said predetermined point is an electrical common point.

3. A radio receiver as claimed in claim 1, wherein there are a plurality of said accepting means and further comprising an automatic scanning means, said predetermined point being the output of said automatic scanning means which is connected to said one of said conductive members of each pair of said conductive members of a said second receptacle means.

4. A radio receiver as claimed in claim 1, wherein each pair of said conductive members comprise a pair of plates opposed to each other for accepting one of said terminals of said frequency-determining crystal means therebetween.

5. A radio receiver as claimed in claim 1, wherein said band switching means comprises a first band switch and a second band switch for selection of two bands.

6. A radio receiver as claimed in claim 5, wherein a said accepting means for said frequency-determining crystal means comprises a common receptacle for said first receptacle means connected to said oscillator means and two pairs of said conductive members for said second receptacle means, each of said two pairs of said conductive members being disposed about said common receptacle with said one of said conductive members of each of said pairs connected to said predetermined point, and with said other of said conductive members of each of said pairs being respectively connected to said first band switch and said second band switch for selectively choosing either one of said bands upon insertion of one of said two terminals of said frequency-determining crystal means in one of the corresponding pairs of conductive members of said first receptacle and the other of said terminals in said common receptacle.

7. A radio receiver capable of tuning to a plurality of separately predetermined frequencies in each of a plurality of predetermined bands which comprises a radio frequency section for each of said bands, each of said frequency sections having radio frequency receiving means and mixer means coupled to said radio frequency receiving means, oscillator means for applying beating signals to each of said mixer means, frequency-determining crystal means having two terminals thereon for connection to said oscillator means so that said oscillator means will oscillate at one of said predetermined frequencies in one of said predetermined bands, audio detection means coupled to each of said mixer means for producing an audio signal when a radio frequency signal is being received, band-switching means for selectively actuating each of said radio frequency sections of each of said plurality of said bands, and means for accepting a said frequency-determining crystal means, said accepting means including first receptacle means connected to said oscillator means and second receptacle means comprising a plurality of pairs of conductive members spaced from each other, one of said conductive members of each of said pairs connected to a predetermined point for exciting said oscillator means at a predetermined frequency of a respective crystal means and the other of said conductive members of each of said pairs connected to said band-switching means so that upon insertion of said two terminals of a said frequency-determining crystal means into said first and second receptacle means so that upon insertion of said two terminals of a said frequency-determining crystal means into said first and second receptacle means said crystal means is connected to said oscillator means at one terminal thereof accepted in said first receptacle means, with the other terminal of said crystal means accepted in said second receptacle means connecting the conductive members of the pair of said conductive members to connect said predetermined point with said band-switching means so as to operate said band-switching means and to actuate said radio frequency section for the band containing the predetermined frequency corresponding to said frequency-determining crystal means.

8. A radio receiver as claimed in claim 7, wherein said audio detection means further includes squelch means for preventing the production of an audio signal when a radio frequency is not being received, and automatic scanning means coupled to said squelch means through a pulse generator, one of said conductive members of each of said pairs of conductive members being connected to said automatic scanning means so as to sequentially connect one of said terminals of said frequency-determining crystal means to an electrical common point for inserting said frequency-determining crystal means into an oscillating relationship with said oscillator means.

9. A radio receiver as claimed in claim 7, wherein said band-switching means comprises a first band switch and a second band switch for two band selection.

10. A radio receiver as claimed in claim 7, wherein said accepting means for said frequency-determining crystal means comprises a plurality of sets of receptacle means, said receptacle means of each of said sets comprising a common receptacle for said first receptacle means with said common receptacle being disposed between two pairs of said conductive members of said second receptacle means arranged in line with said common receptacle, said common receptacle of each of said plurality of sets of receptacle means being connected to said oscillator means, one of said two pairs of said conductive members of said second receptacle means forming receptacles for a first band together with said common receptacle and the other of said two pairs of said conductive members of said second receptacle means forming receptacles for a second band together with said common receptacle, one conductive member of each of said pairs of said conductive members for said first and second band receptacles being connected to said predetermined point, the other of said pair of conductive members for said first band receptacle being connected to said first band switch which is connected to said radio frequency section through a corresponding resistor, and the other of said pair of conductive members for said second band receptacle being connected to said second band switch which is connected to said radio frequency section through a corresponding resistor.

11. A radio receiver capable of tuning to at least one predetermined frequency in each of a plurality of predetermined bands which comprises a radio frequency section for each of said bands, each of said radio frequency sections having radio frequency receiving means and mixer means coupled to said radio frequency receiving means, oscillator means coupled to the mixer means of a first band for applying a beating frequency signal output to said mixer means, said oscillator means being further coupled to a first tripler means which is coupled to a mixer means of a second band and also to an auxiliary first tripler means coupled to second tripler means which is coupled to a mixer means of a third band, said auxiliary first tripler means being adjusted in a triple frequency multiplication relationship having a predetermined frequency deviation from that of said first tripler means, at least one frequency-determining crystal means for oscillating at a said predetermined frequency in one of said predetermined bands, audio detection means coupled to the mixer means of each of said first, second and third bands for producing an audio signal when a radio frequency signal is being received, and band-switching means for actuating each of said radio frequency sections for each of said first, second and third bands.

12. A radio receiver capable of tuning to at least one predetermined frequency in each of a plurality of predetermined bands which comprises a radio frequency section for each of said bands, each of said radio frequency sections having radio frequency receiving means and mixer means coupled to said radio frequency receiving means, oscillator mens coupled to the mixer means of a first band for applying a beating frequency signal output to said mixer means, said oscillator means being further coupled to a first tripler means which is coupled to the mixer means of a second band and also to an auxiliary first tripler means coupled to a second tripler means which is in turn coupled to the mixer means of a third band, said auxiliary first tripler means being adjusted in a triple frequency multiplication relationship having a predetermined frequency deviation from that of said first tripler means, at least one frequency-determining crystal means having two terminals thereon for oscillating at a predetermined frequency in one of said predetermined bands, audio detection means coupled to the mixer means of each of said first, second and third bands for producing an audio signal when a radio frequency signal is being received, band-switching means for actuating each of said radio frequency sections for each of said first, second and third bands, and means for accepting said frequency-determining crystal means, said accepting means including first receptacle means connected to said oscillator means and second receptacle means comprising a plurality of pairs of conductive members spaced from each other with one of said conductive members in each of said pairs connected to a predetermined point for exciting said oscillator means at a predetermined frequency and with the other of said conductive members of each of said pairs connected to said band-switching means, so that upon insertion of said two terminals of a said frequency-determining crystal means into said first and second receptacle means, said crystal means is connected to said oscillator means at one terminal thereof accepted in said first receptacle means, with the other terminal of said frequency-determining crystal means accepted in said second receptacle means connecting the conductive members of the pair of said conductive members to connect said predetermined point with said band-switching means so as to operate said band-switching means and to actuate said radio frequency section for the band containing the predetermined frequency corresponding to said frequency-determining crystal means.

13. A radio receiver as claimed in claim 12, wherein said band switching means comprises a first band switch, a second band switch and a third band switch for selection of three bands.

14. A radio receiver as claimed in claim 13, wherein a said accepting means for said frequency-determining crystal means comprises a common receptacle for said first receptacle means connected to said oscillator means and three pairs of said conductive members for said second receptacle means, each of said three pairs of said conductive members being disposed about said common receptacle with said one of said conductive members of each of said pairs connected to said predetermined point, and with said other of said conductive members of each of said pairs being respectively connected to said first band switch, said second band switch or said third band switch for selectively choosing either one of said bands upon insertion of one of said two terminals of said frequency-determining crystal means in one of the corresponding pairs of said conductive members of said receptacle and the other of said terminals in said common receptacle.

15. A radio receiver capable of tuning to a plurality of separately predetermined frequencies in plurality of predetermined bands which comprise a radio frequency section for each of said bands, each of said radio frequency sections having radio frequency receiving means and mixer means coupled to said radio frequency receiving means, oscillator means coupled to the mixer means of a first band for applying a beating signal output to said mixer, said oscillator means being further coupled to a first tripler means which is coupled to the mixer means of a second band and also to an auxiliary first tripler means coupled to a second tripler means which is in turn coupled to the mixer means of a third band, said auxiliary first tripler means being adjusted in a triple frequency multiplication relationship having a predetermined frequency deviation from that of said first tripler means, frequency-determining crystal means having two terminals thereon for oscillating at a predetermined frequency in one of said predetermined bands, audio detection means coupled to the mixer means of each of said first, second and third bands for producing an audio signal when a radio frequency signal is being received, said audio detection means further including squelch means for the prevention of producing an audio signal when a radio frequency signal is not being received, automatic scanning means coupled to said squelch means through a pulse generator, band-switching means for actuating each of said radio frequency sections for each of said first, second and third bands and for actuating said first, auxiliary first and second tripler means, and means for accepting said frequency-determining crystal means, said accepting means including first receptacle means connected to said oscillator means and second receptacle means comprising a plurality of pairs of conductive members spaced from each other, one of said conductive members in each of said pairs connected to a predetermined point for exciting said oscillator means at a predetermined frequency and with the other of said conductive members of each of said pairs connected to said band-switching means, so that upon insertion of said two terminals of a said frequency-determining crystal means into said first and second receptacle means, said crystal means is connected to said oscillator means at one terminal thereof accepted in said first receptacle means with the other terminal of said crystal means accepted in said second receptacle means connecting the conductive members of the pair of said conductive members to connect said predetermined point with said band-switching means so as to operate said band-switching means and to actuate said radio frequency section for the band containing the predetermined frequency corresponding to said frequency-determining crystal means.

16. A radio receiver as claimed in claim 15, wherein said band switching means comprises a first band switch, a second band switch and a third band switch for selection of three bands.

17. A radio receiver as claimed in claim 15, wherein said accepting means for said frequency-determining crystal means comprises a plurality of sets of receptacle means, each set of said receptacle means comprising two common receptacles arranged in line with and connected to each other for said first receptacle means, with said common receptacles being disposed adjacent two pairs of said conductive members and one further pair of said conductive members, said common receptacles of each of said plurality of sets of receptacle means being connected to said oscillator means, a respective pair of said three pairs of said conductive members forming receptacles for said first, second and third bands together with one of said common receptacles, one of said conductive members in each of said pair of conductive members for said first, second and third band receptacles being connected to said predetermined point, the other of said conductive members for said first band receptacle being connected to said first band switch which is coupled to said radio frequency section through a corresponding resistor, the other of said conductive members of said second band receptacle being connected to said second band switch which is coupled to said radio frequency section through a corresponding resistor, and the other of said conductive members for said third band receptacle being connected to said third band switch which is coupled to said radio frequency section through a corresponding resistor.

18. A radio receiver as claimed in claim 16, wherein said accepting means for said frequency-determining crystal means comprises a plurality of sets of receptacle means, each set of said receptacle means comprising a common receptacle for said first receptacle means with said common receptacle being disposed between two pairs of said conductive members arranged in line with each other and one pair of said conductive members, said common receptacle of each of said plurality of sets of receptacle means being connected to said oscillator means, one pair of each of said three pairs of said conductive member respectively forming receptacles for said first, second and third bands, together with said common receptacle, one of said conductive members of each of said first, second and third band receptacles being connected to said predetermined point, the other of said conductive members of said first band receptacle being connected to said first band switch which is coupled to said radio frequency section through a corresponding resistor, the other of said conductive members of said second band receptacle being connected to said second band switch which is coupled to said radio frequency section through a correponding resistor, and the other of said conductive members of said third band receptacle being connected to said third band switch which is coupled to said radio frequency section through a corresponding resistor.

19. A radio receiver as in claim 18 wherein said common receptacles and said three pairs of conductive members are arranged in line with one another.

20. A radio receiver as claimed in claim 15, wherein said accepting means for said frequency-determining crystal means comprises a plurality of sets of receptacle means, each set of said receptacle means comprising three common receptacles connected to one another for said first receptacle means and three pairs of said conductive members, each of said three common receptacles being disposed opposite a corresponding one pair of said three pairs of said conductive members so as to form a respective receptacle for each of said first, second and third bands, said common receptacles on each of said plurality of sets of receptacle means being connected to said oscillator means, one of said conductive members of each of said three pairs of said first, second and third band receptacles being connected to said predetermined point, the other of said conductive members for said first band receptacle being connected to said first band switch which is coupled to said radio frequency section through a corresponding resistor, the other of said conductive members of said second band receptacle being connected to said second band switch which is coupled to said radio frequency section through a corresponding resistor, and the other of said conductive members of said third band receptacle being connected to said third band switch which is coupled to said radio frequency section through a corresponding resistor.

21. A radio receiver as in claim 20 wherein said three common receptacles are arranged in a first line and said three pairs of conductive members are arranged in a second line opposite said first line.

* * * * *